United States Patent [19]

Nakao

[11] Patent Number: 5,016,084

[45] Date of Patent: May 14, 1991

[54] SEMICONDUCTOR DEVICE

[75] Inventor: Shin Nakao, Itami, Japan

[73] Assignee: Mitsubishi Denki Kabushiki Kaisha, Japan

[21] Appl. No.: 503,100

[22] Filed: Apr. 2, 1990

Related U.S. Application Data

[63] Continuation of Ser. No. 310,874, Feb. 16, 1989, abandoned.

[30] Foreign Application Priority Data

Dec. 8, 1988 [JP] Japan .................. 63-308806

[51] Int. Cl.$^5$ .................. H05K 7/20; H01L 23/30
[52] U.S. Cl. .................. 357/72; 357/81; 437/211; 437/224
[58] Field of Search .................. 357/72, 74

[56] References Cited

U.S. PATENT DOCUMENTS

| | | | |
|---|---|---|---|
| 3,911,561 | 10/1975 | Quinn | 437/224 |
| 3,942,245 | 3/1976 | Jackson et al. | 437/211 |
| 4,330,790 | 5/1982 | Burns | 357/72 |
| 4,392,151 | 7/1983 | Iwatani | 357/72 |
| 4,633,573 | 1/1987 | Scherer | 375/72 |
| 4,691,225 | 9/1987 | Murakami et al. | 357/74 |
| 4,701,999 | 10/1987 | Palmer | 357/70 |
| 4,829,403 | 5/1989 | Harding | 357/81 |

FOREIGN PATENT DOCUMENTS

| | | | |
|---|---|---|---|
| 0160171 | 12/1979 | Japan | 437/218 |
| 0074149 | 6/1980 | Japan | 437/211 |
| 0121662 | 9/1980 | Japan | 437/211 |
| 0085539 | 5/1983 | Japan | 437/211 |
| 0077446 | 5/1985 | Japan | 357/72 |
| 2164794 | 3/1986 | United Kingdom | 437/216 |

OTHER PUBLICATIONS

Michael Lancaster, "Tape Automated . . . Density?", Nepcon West, 1987, pp. 503–515.
Thomas A. Scharr, "Tab Bonding . . . Die", ISHM, 1983, pp. 561–565.

Primary Examiner—Andrew J. James
Assistant Examiner—Viet Q. Nguyen
Attorney, Agent, or Firm—Leydig, Voit & Mayer

[57] ABSTRACT

A semiconductor device is provided with an electrically conductive cap having a sufficiently thick edge portion for preventing warpage due to the hardening of an encapsulating resin. Since the edge portion of the conductive cap is formed into the shape of a frame, and its thickness is made large, the mechanical strength of the conductive cap is improved, so that even when stress is applied to the conductive cap owing to the hardening of the encapsulating resin, the conductive cap is unlikely to undergo deformation, thereby preventing the warping of the semiconductor device.

15 Claims, 2 Drawing Sheets

SEMICONDUCTOR DEVICE

This application is a continuation of application Ser. No. 310,874, filed Feb. 16, 1989, now abandoned.

BACKGROUND OF THE INVENTION

1. Field of the Invention

The present invention relates to a semiconductor device, and more particularly to improvements of a package structure of a resin encapsulated-type semiconductor device which is formed by means of a TAB (tape automated bonding) system using a tape carrier.

2. Description of the Invention

FIG. 1 is a cross-sectional view illustrating a package structure of a semiconductor device produced by a conventional TAB system. FIG. 2 is a cross-sectional view illustrating the package of the semiconductor device shown in FIG. 1 which has warped after resin encapsulation. In these drawings, a semiconductor element 1 with an electrodes 2 provided thereon is mounted on an electrically conductive cap 5 by means of a first adhering member 7. A lead 4 is connected to the electrode 2. This lead 4 is formed of, for instance, a copper foil having a thickness of 35 μm and comprises an inner lead portion 4a supported on a support tape 3, which serves an insulating film, and an outer lead portion 4b formed on an outer end portion of the support tape 3 and projecting toward the outside for connection to an external circuit (not shown). The inner lead portion 4a and the outer lead portion 4b are formed by being plated with Au or Sn after the carrier tape is laminated with a copper foil and a lead pattern is formed by photo-etching. The conductive cap 5 is formed by drawing a sheet formed of, for instance, a iron-nickel alloy with a thickness of 0.1 mm and by plating the drawn sheet with Ag. The rear surface of the semiconductor element 1 is adhered to a recess of the conductive cap 5 by means of the first adhering member 7, such as solder or a conductive adhesive. When the rear surface of the semiconductor element 1 requires a certain potential, the conductive cap 5 serves as an electrical path therefor, and when the semiconductor device operates, the conductive cap 5 serves as a heat radiating surface. The support tape 3 is supported by a collar 6 of the conductive cap 5 and is formed by stamping out a carrier tape which is similar to the one mentioned above and is formed of a 125 μm-thick polyimide film used as a cinema film and provided with perforations. The support tape 3 is provided with a through hole 8, and a conductive member 8a formed by plating or the like is disposed in this through hole 8. By means of this conductive member 8a, a connecting pattern (not shown) of the lead 4 for supplying a rear-surface potential to the semiconductor element 1 and a conductive sheet 11 formed by laminating the rear surface of the support tape 3 with, for instance, a 35 μm-thick copper foil and by subjecting the same to photo-etching. The collar 6 and the conductive sheet 11 are bonded to each other by means of a second adhering member 10. When a solder ring is used as the second adhering member 10, a bent end portion 12 of the conductive cap 5 facilitates positioning thereof, and when a conductive adhesive is used, the portion 12 prevents the adhesive from leaking out. The conductive cap 5, the semiconductor element 1, connecting portions thereof, etc. are covered with an encapsulating resin 9 such as epoxy resin for the purpose of protection.

A conventional semiconductor device is arranged as described above, and in order to assemble this semiconductor device, the carrier tape is first provided with required perforated portions to form the support tape 3. Patterns of the leads 4 and the conductive sheet 11 are formed on the obverse and reverse sides of this support tape 3. The conductive member 8a is disposed in the through hole 8 of the support tape 3, and the connecting pattern of the leads 4 for supplying a rear-surface potential to the semiconductor element 1 is connected to the conductive sheet 11 by means of this conductive member 8a. Furthermore, the tip portion of the inner lead portion 4a is aligned with the electrode 2 of the semiconductor element 1, and the electrode 2 and the inner lead 4a are heated and contact bonded to each other using a bonding tool.

Subsequently, square-shaped solder rings, which are used as the first and second adhering members 7, 10, are respectively disposed on the collar 6 and the bottom 5a of the conductive cap 5, or a conductive adhesive is applied thereto. Then, the semiconductor element 1 and the support tape 3 are positioned on the adhering members 7, 10. The solder rings are simultaneously heated and hardened, or portions of the conductive adhesive applied to the parts mentioned above are simultaneously heated and hardened, thereby simultaneously effecting bonding between the conductive cap 5 and the semiconductor element 1 and between the collar 6 and the conductive sheet 11. Subsequently, with the support tape 3 and the collar 6 of the conductive cap 5 clamped together, encapsulation with the encapsulating resin 9 is effected, thereby completing a semiconductor device.

In the above-described semiconductor device, since the edge portion of the conductive cap is shaped into the form of a collar, the mechanical strength of the edge portion of the conductive cap is weak. Accordingly, there has been a drawback in that, as shown in FIG. 2, the semiconductor device can warp due to the stress resulting from hardening and shrinkage of the encapsulating resin 9, with the result that excessive stress is applied to the semiconductor element 1, which is undesirable for good operation and reliability of the semiconductor device.

SUMMARY OF THE INVENTION

Accordingly, an object of the present invention is to provide a semiconductor device in which warpage due to the hardening of an encapsulating resin does not occur, thereby overcoming the above-described drawback of the prior art.

To this end, according to the present invention there is provided a semiconductor device comprising: an electrically conductive cap which has a sufficiently thick edge portion for preventing warpage due to the hardening of an encapsulating resin and which is provided with a recess; a semiconductor element placed in the recess of the conductive cap; an insulating film placed on the edge portion; a lead provided on the insulating film and connected to the semiconductor element; and an encapsulating resin for encapsulating an inner surface of the conductive cap, the semiconductor element, the insulating film, the lead, and the like.

DESCRIPTION OF THE PREFERRED EMBODIMENTS

Figure 1:
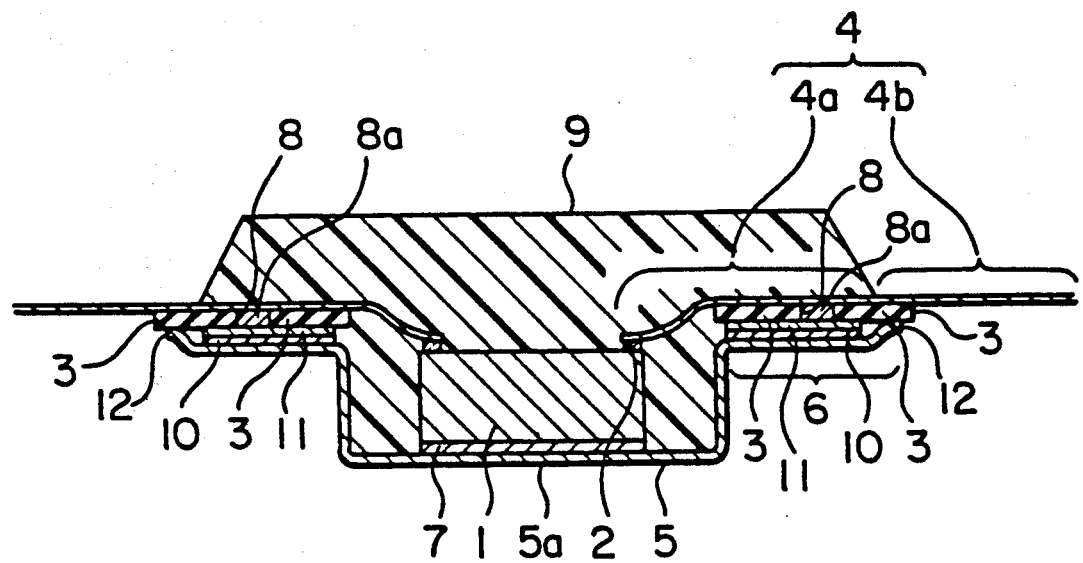
FIG. 1 is a cross-sectional view illustrating a conventional semiconductor device.
Figure 2:
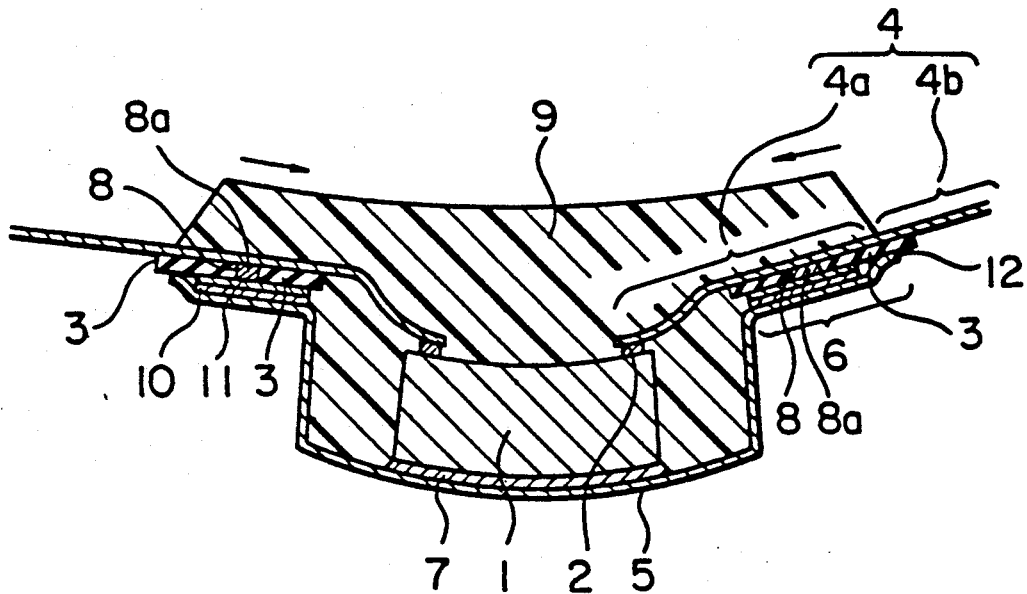
FIG. 2 is a cross-sectional view illustrating the semiconductor device shown in FIG. 1 which as warped.
Figure 3:
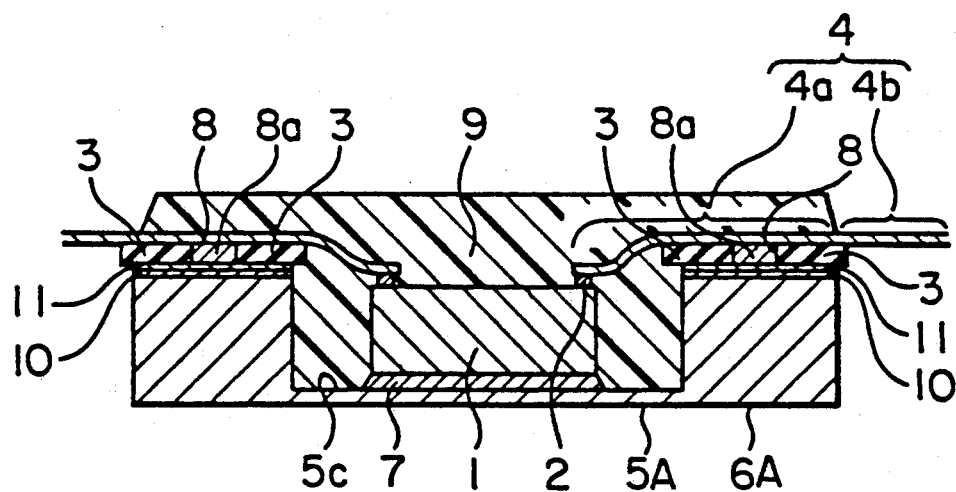
FIG. 3 is a cross-sectional view of a semiconductor device in accordance with an embodiment of the present invention.

FIG. 3 is a cross-sectional view illustrating a semiconductor device in accordance with an embodiment of the present invention, in which reference numerals 1 to 4 and 7 to 11 denote the same components as those of the above-described conventional semiconductor device. An electrically conductive cap 5A has a frame-like edge portion 6A having a sufficient thickness for preventing warpage due to the hardening of the encapsulating resin. Also, the conductive cap 5A has a recess 5c in which a semiconductor element 1 is placed. The semiconductor element 1 provided with an electrode 2 is secured in this recess 5c by means of an adhering member 7. A lead 4 is connected to the electrode 2. This lead 4 is formed of, for instance, a copper film having a thickness of 35 μm, and comprises an inner lead portion 4a supported on a support tape 3, which serves as an insulating film, and an outer lead portion 4b formed on an outer end portion of the support tape 3 and projecting toward the outside for connection to an external circuit (not shown).

In the same way as a conventional device, the conductive cap 5A and the edge portion 6A are formed by drawing a sheet made of, for instance, a iron-nickel alloy and by plating the drawn sheet with Ag. Preferably, the conductive cap 5A and the edge portion 6A are formed by processing a sheet made of a copper-tungsten alloy or a cobalt-molybdenum clad material, which have high mechanical strength and large heat conductivity, followed by providing the same with Ag or Ni/Au plating. The support tape 3 is provided with a through hole 8, and a conductive member 8a formed by plating or the like is disposed in this through hole 8. By means of this conductive member 8a, a connecting pattern (not shown) of the lead 4 for supplying a rear-surface potential to the semiconductor element 1 is connected to a conductive sheet 11 formed on the rear surface of the support tape 3. The inner surface of the conductive cap 5A, the semiconductor device 1, the support tape 3, the lead 4, and the like are covered with an encapsulating resin 9 such as epoxy resin for the purpose of protection.

The semiconductor device which is arranged as described above is assembled in the same manner as that for the above-described conventional device. However, at the time when encapsulation with the encapsulating resin 9 is effected, the support tape 3 and the bottom portion of the conductive cap 5A are clamped and resin encapsulation is carried out to complete the assembly of the semiconductor device.

Figure 4:
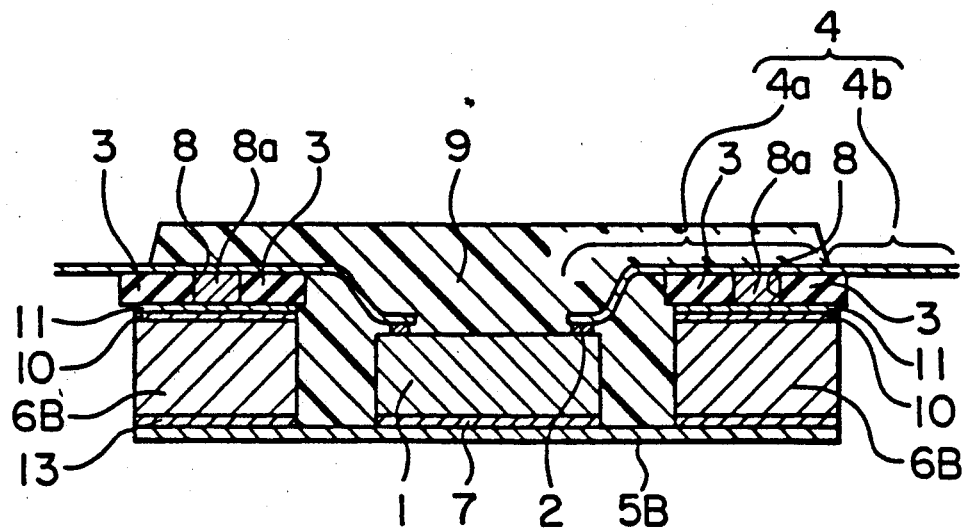
FIG. 4 is a cross-sectional view of a semiconductor device in accordance with another embodiment of the present invention.

Although, in the above-described embodiment, the bottom portion and the edge portion 6A of the conductive cap 5A are formed integrally, in a case where processing is difficult as in the case of a copper-tungsten alloy, an arrangement may be alternatively provided such that, as shown in FIG. 4, after a bottom 5B and an edge portion 6B of the conductive cap 5A are respectively processed independently, the two members may be adhered together by means of a third adhering member 13, such as silver solder. In this embodiment as well, an advantage similar to that of the above-described embodiment can be obtained.

As shown in FIGS. 3 and 4, semiconductor element 1 has a thickness transverse to the bottom wall of conductive cap 5 that is less than the corresponding height of edge portion 6A or of 6B transverse to the bottom wall. Preferably, the heights of the edge portions 6A and 6B are at lest equal to or greater than the thickness of semiconductor element 1 so that no part of element 1 protrudes from the recess to interfere with the application of the encapsulant 9.

What is claimed is:

1. A semiconductor device comprising:
   an electrically conductive cap including a bottom wall and a contiguous edge portion transverse to said bottom wall, said bottom wall and edge portion defining a recess bounded by said edge portion and said bottom wall;
   a semiconductor element disposed in the recess;
   an insulating film disposed on said edge portion adjacent the recess and generally parallel to said bottom wall;
   a lead disposed on said insulating film and connected to said semiconductor element; and
   an encapsulating resin disposed in said recess encapsulating said semiconductor element, said insulating film, and said lead, wherein said edge portion and bottom wall have thicknesses generally parallel to and transverse to said bottom wall, respectively, and said edge portion has a thickness greater than the thickness of said bottom wall whereby warpage of said bottom wall when said encapsulating resin is cured is prevented.

2. A semiconductor device according to claim 1 wherein said semiconductor element has a thickness transverse to said bottom wall and the height of said edge portion transverse to said bottom wall is at least equal to the thickness of said semiconductor element.

3. A semiconductor device according to claim 1 wherein said conductive cap is formed of one of an alloy of nickel and iron and an alloy of copper and tungsten.

4. A semiconductor device according to claim 1 wherein said conductive cap is formed of a cladded material for enhancing the heat conductivity of said cap.

5. A semiconductor device according to claim 1, including a conductive sheet disposed on said insulating film opposite said lead wherein said conductive sheet and said edge portion are adhered together.

6. A semiconductor device according to claim 5 wherein said insulating film contains a through hole and wherein said lead passes through the through hole to electrically connect to said conductive sheet.

7. A semiconductor device according to claim 4 wherein said cladded material includes cobalt-molybdenum cladding.

8. A semiconductor device comprising:
   an electrically conductive metallic cap having a metallic cladding layer and including a bottom wall and a contiguous edge portion transverse to said bottom wall, said bottom wall and edge portion defining a recess bounded by said edge portion and said bottom wall;
   a semiconductor element disposed in the recess;
   an insulating film disposed on said edge portion adjacent the recess and generally parallel to said bottom wall;

a lead disposed on said insulating film and connected to said semiconductor element; and an encapsulating resin disposed in said recess encapsulating said semiconductor element, said insulating film, and said lead, wherein said edge portion and bottom wall have thicknesses generally parallel to and transverse to said bottom wall, respectively, and said edge portion has a thickness greater than the thickness of said bottom wall whereby warpage of said bottom wall when said encapsulating resin is cured is prevented.

9. A semiconductor device according to claim 8 wherein the metallic cladding layer is a cobalt-molybdenum cladding layer.

10. A semiconductor device according to claim 8 wherein said edge portion and said bottom wall are unitary.

11. A semiconductor device according to claim 8 wherein said edge portion is non-contiguous and adhered to said bottom wall of said conductive cap.

12. A semiconductor device according to claim 8 wherein said semiconductor element has a thickness transverse to said bottom wall and the height of said edge portion transverse to said bottom wall is at least equal to the thickness of said semiconductor element.

13. A semiconductor device according to claim 8 wherein said conductive cap is formed of one of an alloy of iron and nickel and an alloy of copper and tungsten.

14. A semiconductor device according to claim 8 including a conductive sheet disposed on said insulating film opposite said lead wherein said conductive sheet and said edge portion are adhered together.

15. A semiconductor device according to claim 8 wherein said insulating film contains a through hole and wherein said lead passes through the through hole to electrically connect to said conductive sheet.

* * * * *